(12) United States Patent
Cheng et al.

(10) Patent No.: US 11,018,166 B2
(45) Date of Patent: May 25, 2021

(54) DISPLAY SUBSTRATE AND MANUFACTURING METHOD THEREOF, DISPLAY APPARATUS

(71) Applicant: BOE TECHNOLOGY GROUP CO., LTD., Beijing (CN)

(72) Inventors: Leilei Cheng, Beijing (CN); Rui Peng, Beijing (CN); Dongfang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/521,408

(22) PCT Filed: Feb. 16, 2016

(86) PCT No.: PCT/CN2016/073837
§ 371 (c)(1),
(2) Date: Apr. 24, 2017

(87) PCT Pub. No.: WO2017/041435
PCT Pub. Date: Mar. 16, 2017

(65) Prior Publication Data
US 2017/0309654 A1    Oct. 26, 2017

(30) Foreign Application Priority Data
Sep. 9, 2015   (CN) .......................... 201510571922.2

(51) Int. Cl.
*H01L 27/12*     (2006.01)
*H01L 29/417*    (2006.01)
*H01L 29/786*    (2006.01)

(52) U.S. Cl.
CPC ...... *H01L 27/1292* (2013.01); *H01L 27/1218* (2013.01); *H01L 27/1225* (2013.01);
(Continued)

(58) Field of Classification Search
None
See application file for complete search history.

(56) References Cited

U.S. PATENT DOCUMENTS 7,544,528 B2 *   6/2009   Lee .................. G02F 1/136286
                                                  257/E21.431
7,928,429 B2 *   4/2011   Lee ....................... H01L 51/105
                                                       257/40
(Continued)

FOREIGN PATENT DOCUMENTS

CN           1832220 A       9/2006
CN         101807585 A       8/2010
(Continued)

OTHER PUBLICATIONS

First Office Action dated Jun. 26, 2017 corresponding to Chinese application No. 201510571922.2.
(Continued)

*Primary Examiner* — Abul Kalam
(74) *Attorney, Agent, or Firm* — Nath, Goldberg & Meyer; Joshua B. Goldberg

(57) ABSTRACT

The present disclosure provides a display substrate and a manufacturing method thereof, and a display apparatus, the manufacturing method comprises: forming a base; forming a thin film transistor on the base, the thin film transistor comprises a gate, a source, a drain and an active layer, a first insulating layer is formed on the base, and a second insulating layer is formed between the gate and the active layer, the active layer is formed in the first insulating layer; forming a third insulating layer above the thin film transistor; forming a pixel electrode above the third insulating layer; forming a fourth insulating layer above the pixel electrode, a material of at least one of the base, the first insulating layer, the second insulating layer, the third insulating layer and the fourth insulating layer includes an
(Continued)

organic material, and a material of at least one of them includes an inorganic material.

7 Claims, 7 Drawing Sheets

(52) U.S. Cl.
CPC ...... *H01L 27/1248* (2013.01); *H01L 27/1262* (2013.01); *H01L 29/41733* (2013.01); *H01L 29/7869* (2013.01)

(56) References Cited

U.S. PATENT DOCUMENTS

| | | | | |
|---|---|---|---|---|
| 8,877,584 B2* | 11/2014 | Suzuki | ............ | G03F 7/2053 |
| | | | | 257/E21.412 |
| 2003/0175427 A1* | 9/2003 | Loo | ............ | B82Y 10/00 |
| | | | | 427/256 |
| 2006/0038182 A1* | 2/2006 | Rogers | ............ | B82Y 10/00 |
| | | | | 257/77 |
| 2006/0145146 A1 | 7/2006 | Suh et al. | | |
| 2008/0001232 A1* | 1/2008 | Lee | ............ | G02F 1/136286 |
| | | | | 257/368 |
| 2012/0138936 A1 | 6/2012 | Lee et al. | | |
| 2012/0312583 A1* | 12/2012 | Suzuki | ............ | G03F 7/2053 |
| | | | | 174/250 |
| 2015/0129881 A1* | 5/2015 | Kong | ............ | H01L 27/1248 |
| | | | | 257/72 |
| 2016/0027813 A1 | 1/2016 | Xu et al. | | |
| 2016/0043116 A1 | 2/2016 | Sun et al. | | |

FOREIGN PATENT DOCUMENTS

| | | |
|---|---|---|
| CN | 102487070 A | 6/2012 |
| CN | 103489922 A | 1/2014 |
| CN | 103681659 A | 3/2014 |
| CN | 103928398 A | 7/2014 |
| CN | 105047677 A | 11/2015 |
| JP | 2006041219 A | 2/2006 |

OTHER PUBLICATIONS

International Search Report dated Jun. 15, 2016 corresponding to application No. PCT/CN2016/073837.
Written Opinion of the International Searching Authority dated Jun. 15, 2016 corresponding to application No. PCT/CN20161073837.

* cited by examiner

DISPLAY SUBSTRATE AND MANUFACTURING METHOD THEREOF, DISPLAY APPARATUS

CROSS REFERENCE TO RELATED APPLICATION

This is a National Phase Application filed under 35 U.S.C. 371 as a national stage of PCT/CN2016/073837, filed Feb. 16, 2017, an application claiming the benefit of Chinese Application No. 201510571922.2, filed Sep. 9, 2015, the content of each of which is hereby incorporated by reference in its entirety.

TECHNICAL FIELD

The present disclosure relates to a field of display technology, and particularly, to a manufacturing method of a display substrate, a display substrate and a display apparatus.

BACKGROUND

In a thin film transistor (TFT) on a flexible substrate of prior art, an insulating layer between conductive structures is generally only made of organic material or inorganic material.

For the thin film transistor with the insulating layer only made of organic material, since the organic material is generally polymer, and the polymer has a relatively small dielectric constant, the thin film transistor will have a relatively high threshold voltage due to the insulating layer only made of polymer, resulting in a relatively large leakage current, which will affect electrical properties of the thin film transistor.

For the thin film transistor with the insulating layer only made of inorganic material, although the inorganic material has a relatively large dielectric constant, while forming the insulating layer, it is impossible to produce a layer of inorganic material with a relatively large thickness all at once, and it is necessary to coat the inorganic material layer by layer to obtain the insulating layer with a required thickness, resulting in a large number of processes.

SUMMARY

Embodiments of the present disclosure provide a manufacturing method of a display substrate, including steps of:
forming a base;
forming a thin film transistor on the base,
wherein, the thin film transistor includes a gate, a source, a drain and an active layer, a first insulating layer is formed on the base, and a second insulating layer is formed between the gate and the active layer, the active layer is formed in the first insulating layer;
forming a third insulating layer above the thin film transistor;
forming a pixel electrode above the third insulating layer;
forming a fourth insulating layer above the pixel electrode,
wherein, a material of at least one of the base, the first insulating layer, the second insulating layer, the third insulating layer and the fourth insulating layer includes an organic material, and a material of at least one of the base, the first insulating layer, the second insulating layer, the third insulating layer and the fourth insulating layer includes an inorganic material.

In an embodiment of the present disclosure, the step of forming the base may include:
forming a first bulge corresponding to patterns of the source and the drain on a base substrate;
forming a first polydimethylsilane layer, which is hydroxyl-functionalized, on the base substrate, so that a first groove corresponding to patterns of the source and the drain is formed at a position corresponding to the first bulge in a surface of the first polydimethylsilane layer proximal to the base substrate;
stripping off the first polydimethylsilane layer, as the base, from the base substrate.

In an embodiment of the present disclosure, the step of forming the source and the drain may include:
coating octadecyltrichlorosilane on a glass substrate;
contacting a surface of the glass substrate coated with the octadecyltrichlorosilane with a surface of the base formed with the first groove;
removing the glass substrate, and coating hydrophilic solution containing conductive material on the base, so that the source and the drain are formed in the first groove.

In an embodiment of the present disclosure, the step of forming the first insulating layer may include:
forming a second polydimethylsilane layer, as the first insulating layer, on the base;
irradiating light or performing an oxidation process on an upper surface of the first insulating layer, so that a first silicon dioxide layer is formed on the upper surface of the first insulating layer;
etching the first silicon dioxide layer and the first insulating layer to form a via hole corresponding to a pattern of the active layer;
coating hydrophilic solution containing semi-conductive material on the first silicon dioxide layer to form the active layer in the via hole.

In an embodiment of the present disclosure, the step of forming the second insulating layer may include:
forming a third polydimethylsilane layer, as the second insulating layer, on the first insulating layer;
etching the second insulating layer to forming a second groove corresponding to a pattern of the gate;
coating octadecyltrichlorosilane on a glass substrate;
contacting a surface of the glass substrate coated with the octadecyltrichlorosilane with a surface of the second insulating layer formed with the second groove;
removing the glass substrate, and coating hydrophilic solution containing conductive material on the second insulating layer to form the gate in the second groove.

In an embodiment of the present disclosure, the step of forming the third insulating layer may include:
forming a fourth polydimethylsilane layer, as the third insulating layer, on the second insulating layer;
irradiating light or performing an oxidation process on an upper surface of the third insulating layer so that a second silicon dioxide layer is formed on the upper surface of the third insulating layer.

In an embodiment of the present disclosure, the step of forming the fourth insulating layer may include:
forming the fourth insulating layer on the pixel electrode by at least one material of polydimethylsilane, polyimide, polymethyl methacrylate and polyvinyl pyrrolidone.

In an embodiment of the present disclosure, there is provided a display substrate manufactured by the above manufacturing method, the display substrate includes:
a base;
a thin film transistor provided on the base, wherein, the thin film transistor includes a gate, a source, a drain and an active layer;

a first insulating layer provided on the base, the active layer is provided in the first insulating layer;

a second insulating layer provided between the gate and the active layer;

a third insulating layer provided above the thin film transistor;

a pixel electrode provided above the third insulating layer;

a fourth insulating layer provided above the pixel electrode, wherein, a material of at least one of the base, the first insulating layer, the second insulating layer, the third insulating layer and the fourth insulating layer includes an organic material, and a material of at least one of the base, the first insulating layer, the second insulating layer, the third insulating layer and the fourth insulating layer includes an inorganic material.

In an embodiment of the present disclosure, a first groove corresponding to patterns of the source and the drain may be provided in a surface of the base proximal to the first insulating layer, and the source and the drain are provided in the first groove.

In an embodiment of the present disclosure, a via hole corresponding to a pattern of the active layer may be provided in the first insulating layer, and the active layer is provided in the via hole, wherein, a material of the first insulating layer includes polydimethylsilane, and a first silicon dioxide layer is formed on an upper surface of the first insulating layer.

In an embodiment of the present disclosure, a second groove corresponding to a pattern of the gate may be provided in a surface of the second insulating layer proximal to the third insulating layer, and the gate may be provided in the second groove.

In an embodiment of the present disclosure, a material of the third insulating layer may include polydimethylsilane, and a second silicon dioxide layer may be formed on an upper surface of the third insulating layer.

In an embodiment of the present disclosure, a material of the fourth insulating layer may include at least one of polydimethylsilane, polyimide, polymethyl methacrylate and polyvinyl pyrrolidone.

In an embodiment of the present disclosure, there is also provided a display apparatus including the above display substrate.

DESCRIPTION OF THE DRAWINGS

Features and advantages of the present disclosure will be understood more clearly with reference to accompanying drawings, and the drawings are schematic, should not be understood to limit the present disclosure, in the drawings.

DETAILED DESCRIPTION OF THE EMBODIMENTS

In order to make a person skilled in the art understand the object, features and advantages of the present disclosure better, the present disclosure will be further described in detail below in conjunction with the accompanying drawings and specific embodiments. It should be noted that, in absence of conflict, the embodiments in the present application and features of the embodiments may be combined with each other.

Many specific details are described in following descriptions for fully understanding the present disclosure, but the present disclosure may be implemented in other ways different from those described hereafter, thus, the protection scope of the present disclosure is not limited by the specific embodiments disclosed hereafter.

Figure 1:
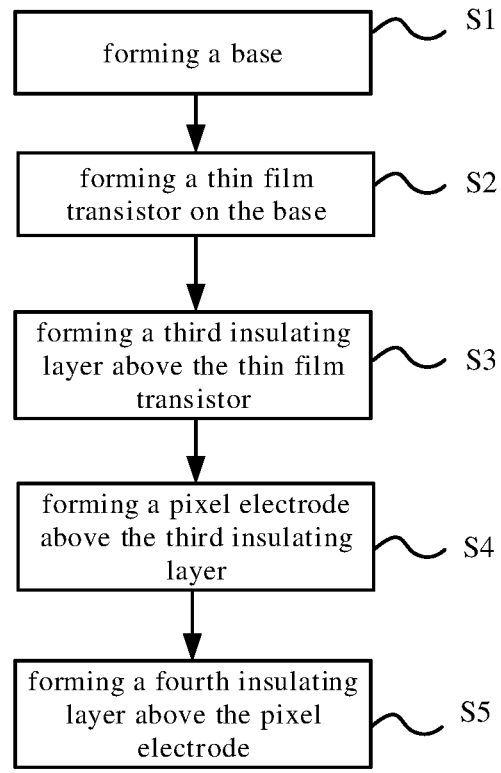
FIG. 1 shows a schematic flow chart of a manufacturing method of a display substrate in an embodiment of the present disclosure.

As shown in FIG. 1, a manufacturing method of a display substrate in accordance with an embodiment of the present disclosure includes steps of:

S1, forming a base 1;

S2, forming a thin film transistor on the base 1, wherein, the thin film transistor comprises a gate 21, a source 22, a drain 23 and an active layer 24, a first insulating layer 3 is formed on the base 1, and a second insulating layer 4 is formed between the gate 21 and the active layer 24, the active layer 24 is formed in the first insulating layer 3;

S3, forming a third insulating layer 5 above the thin film transistor;

S4, forming a pixel electrode 6 above the third insulating layer 5;

S5, forming a fourth insulating layer 7 above the pixel electrode 6, wherein, a material of at least one of the base 1, the first insulating layer 3, the second insulating layer 4, the third insulating layer 5 and the fourth insulating layer 7 includes an organic material, and a material of at least one of the base 1, the first insulating layer 3, the second insulating layer 4, the third insulating layer 5 and the fourth insulating layer 7 includes an inorganic material.

By forming a portion of the insulating layer and the base of the thin film transistor using an organic material and forming the other portion of the insulating layer and the base of the thin film transistor using an inorganic material, the thin film transistor will have advantages of forming the insulating layer and the base of the thin film transistor by the organic material (i.e., the manufacturing process is simplified, it is possible to form the insulating layer integrally and it is not necessary to stack insulating layers layer by layer, the display substrate is flexible and bendable), and simultaneously have advantages of forming the insulating layer and the base of the thin film transistor by the inorganic material (i.e., the insulating layer has a relatively large dielectric constant, a leakage current of the thin film transistor is reduced, and the display substrate has a high toughness and is flexible). Thus, in an aspect, the manufacturing process of the thin film transistor is simplified, and in another aspect, electrical properties of the thin film transistor and physical properties of the display substrate provided with the thin film transistor are improved.

Figure 2:
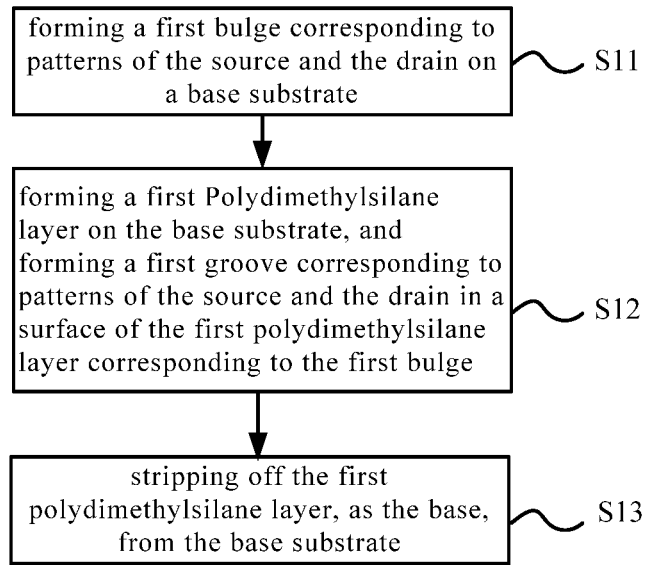
FIG. 2 shows a schematic flow chart of forming a base in an embodiment of the present disclosure.
Figure 7:
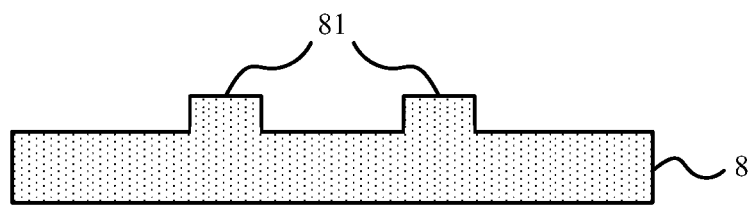
FIG. 7-FIG. 9 show a specific schematic flow chart of forming the base in an embodiment of the present disclosure.
Figure 8:
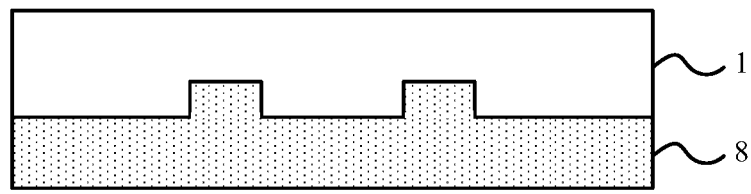
Figure 9:
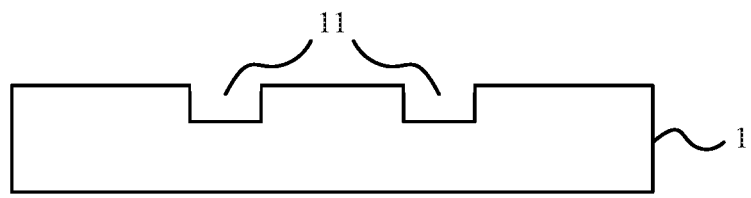

As shown in FIG. 2, in an embodiment of the present disclosure, the step (i.e., S of forming the base 1 comprises sub-steps of:

S11, forming a first bulge 81 corresponding to patterns of the source 22 and the drain 23 on a base substrate 8, as shown in FIG. 7;

S12, forming a first polydimethylsilane (PDMS) layer, which is hydroxyl-functionalized, on the base substrate 8, so that a first groove 11 corresponding to patterns of the source 22 and the drain 23 is formed at a position corresponding to the first bulge 81 in a surface of the first polydimethylsilane layer proximal to the base substrate 8, as shown in FIG. 8;

S13, stripping off the first polydimethylsilane layer, as the base 1, from the base substrate 8, as shown in FIG. 9.

Compared with forming the patterns of the source 22 and the drain 23 in the first polydimethylsilane layer by etching, forming the first groove 11, as the patterns of the source 22 and the drain 23, in the first polydimethylsilane layer in a complementary manner to the first bulge 81 can make the patterns of the source 22 and the drain 23 have a more regular shape, thereby can ensure the source 22 and the drain 23 having good electrical properties.

In an embodiment of the present disclosure, the base substrate 8 may be formed of silicon material, since there are hydroxyl groups at an interface between the first polydimethylsilane layer which is hydroxyl-functionalized, and the silicon substrate, it is easy to strip off the first polydimethylsilane layer from the silicon substrate without a damage of the first polydimethylsilane layer, thus the formed base 1 will have a smooth surface.

Figure 3:
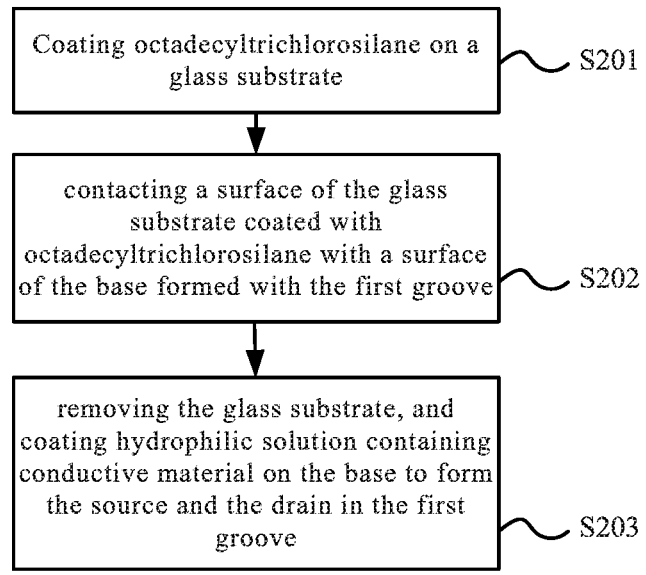
FIG. 3 shows a schematic flow chart of forming a source and a drain in an embodiment of the present disclosure.
Figure 10:
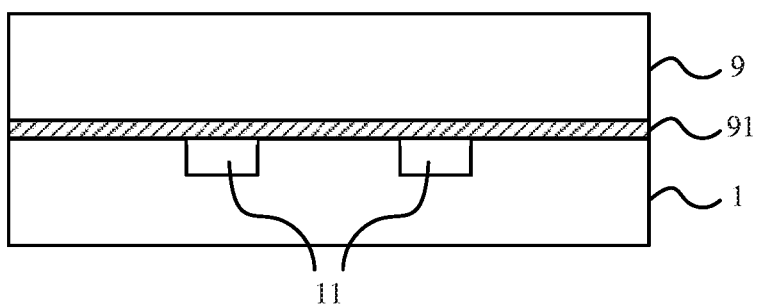
FIG. 10 and FIG. 11 show a specific schematic flow chart of forming the source and the drain in an embodiment of the present disclosure.
Figure 11:
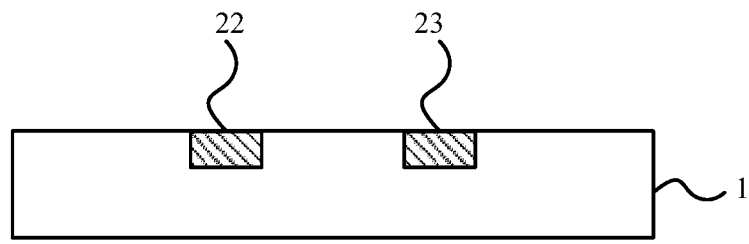

As shown in FIG. 3, in an embodiment of the present disclosure, the step of forming the source 22 and the drain 23 comprises sub-steps of:

S201, coating octadecyltrichlorosilane (OTS) 91 on a glass substrate 9;

S202, contacting a surface of the glass substrate 9 coated with octadecyltrichlorosilane 91 with a surface of the base 1 formed with the first groove 11, as shown in FIG. 10;

S203, removing the glass substrate 9, and coating hydrophilic solution containing conductive material on the base 1, so that the source 22 and the drain 23 are formed in the first groove 11, as shown in FIG. 11.

By contacting the glass substrate 9 coated with the octadecyltrichlorosilane 91 with the base 1, a surface of the base 1 contacts with the octadecyltrichlorosilane 91, so that the surface of the base 1 has a decreased surface tension (surface energy) due to the octadecyltrichlorosilane 91, but an inside of the first groove 11 is not in contact with the octadecyltrichlorosilane 91, thus still remains a relatively high surface tension of the first polydimethylsilane layer itself.

Then, while coating hydrophilic solution (e.g., ethanol) containing conductive material (e.g., metals of aluminum, copper, molybdenum, etc., or alloys) on the base 1, the surface of the base 1 does not absorb the hydrophilic solution, but the inside of the first groove 11 absorbs the hydrophilic solution, after evaporation of the hydrophilic solution, the metals or alloys in the hydrophilic solution are retained in the first groove 11 to form the source 22 and the drain 23. By forming the source 22 and the drain 23 in a manner of the present embodiment, the source 22 and the drain 23 are formed in the base 1, and the combination of the thin film transistor with the base 1 is firm.

Figure 4:
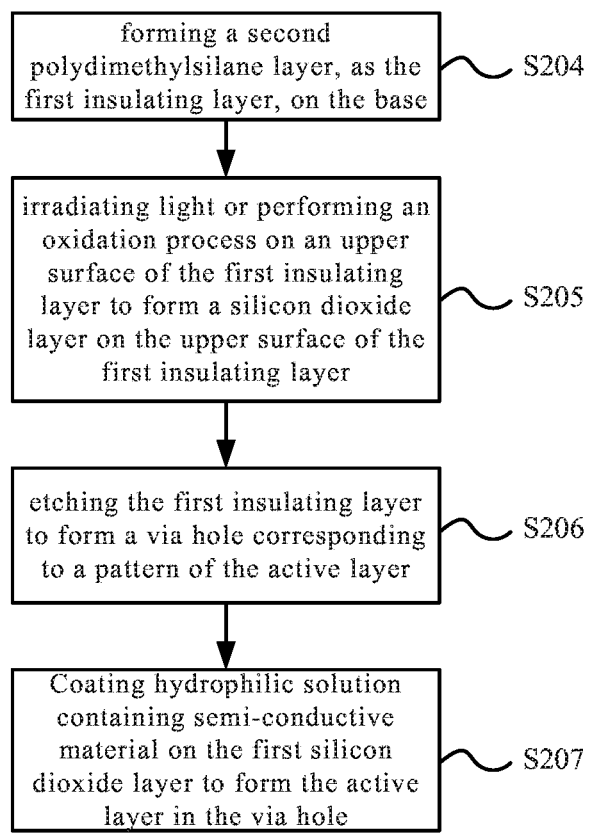
FIG. 4 shows a schematic flow chart of forming a first insulating layer in an embodiment of the present disclosure.
Figure 12:
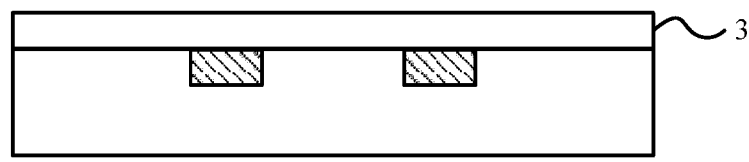
FIG. 12-FIG. 15 show a specific schematic flow chart of forming the first insulating layer in an embodiment of the present disclosure.
Figure 13:
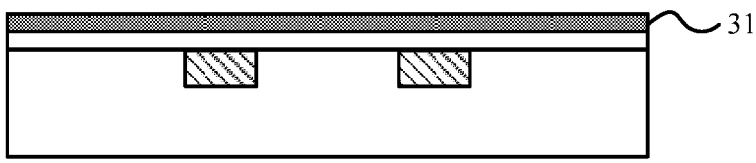
Figure 14:
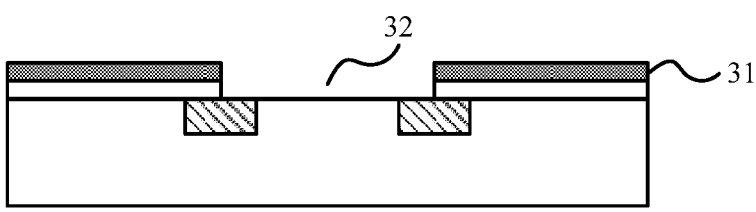
Figure 15:
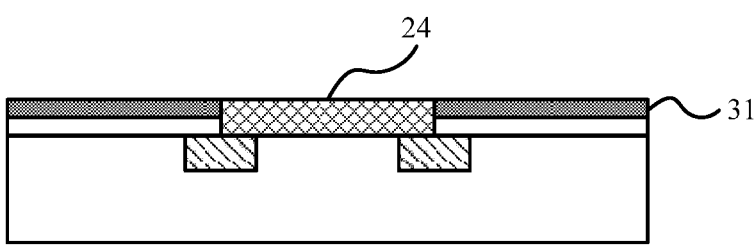

As shown in FIG. 4, in an embodiment of the present disclosure, the step of forming the first insulating layer 3 comprises sub-steps of:

S204, forming a second polydimethylsilane layer, as the first insulating layer 3, on the base 1, as shown in FIG. 12;

S205, irradiating light or performing an oxidation process on an upper surface of the first insulating layer 3 so that a first silicon dioxide layer 31 is formed on the upper surface of the first insulating layer 3, as shown in FIG. 13;

S206, etching the first silicon dioxide layer 31 and the first insulating layer 3 to form a via hole 32 corresponding to a pattern of the active layer 24, as shown in FIG. 14;

S207, coating hydrophilic solution containing semi-conductive material on the first silicon dioxide layer 31 to form the active layer 24 in the via hole 32, as shown in FIG. 15.

By forming the first silicon dioxide layer 31 on the upper surface of the first insulating layer 3, in an aspect, since the silicon dioxide is an inorganic material, the insulating layer of the thin film transistor will have advantages of inorganic material, and in another aspect, since the surface tension of the silicon dioxide is relatively low, while coating the hydrophilic solution containing semi-conductive material on the first silicon dioxide layer 31, the surface of the first silicon dioxide layer 31 does not absorb the hydrophilic solution, but the inside of the via hole 32 absorbs the hydrophilic solution, after evaporation of the hydrophilic solution, the semi-conductive material (e.g., metal oxide semi-conductive material) in the hydrophilic solution is retained in the via hole 32 to form the active layer 24.

Figure 5:
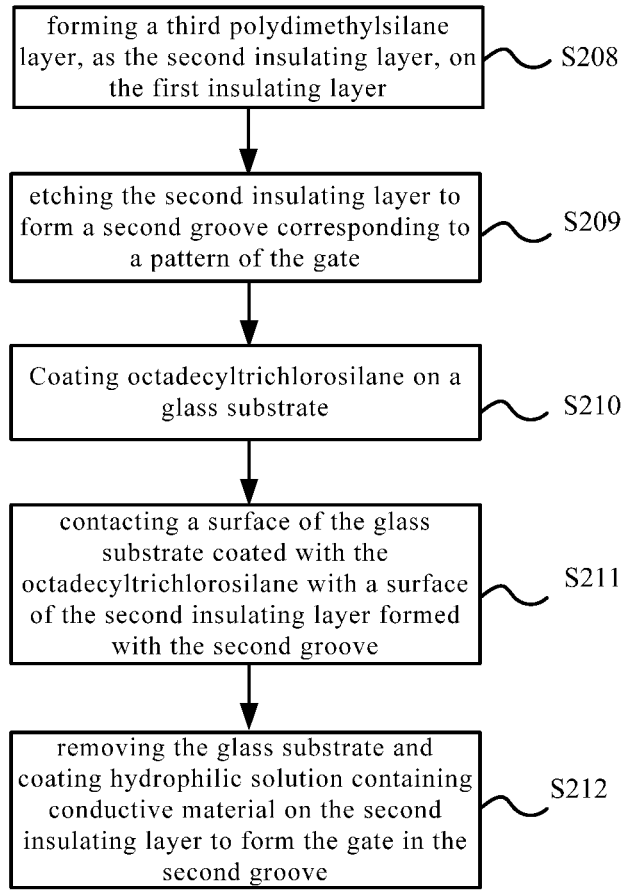
FIG. 5 shows a schematic flow chart of forming a second insulating layer in an embodiment of the present disclosure.
Figure 16:
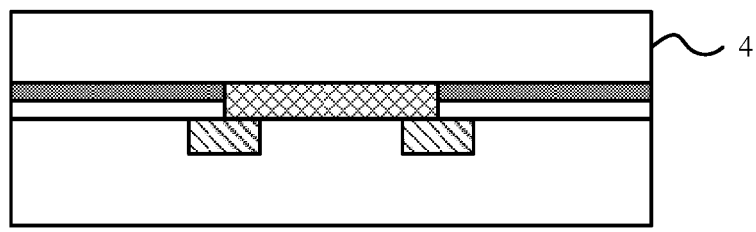
FIG. 16-FIG. 19 show a specific schematic flow chart of forming the second insulating layer in an embodiment of the present disclosure.
Figure 17:
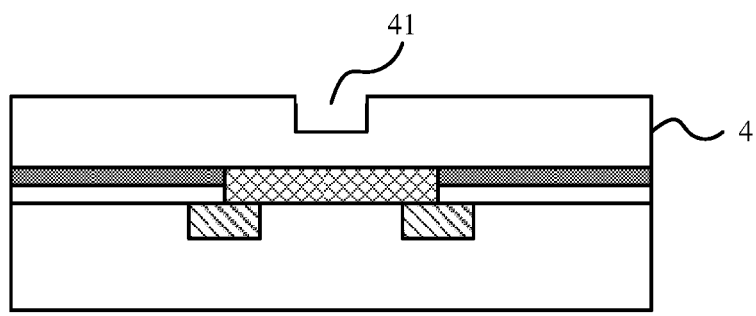
Figure 18:
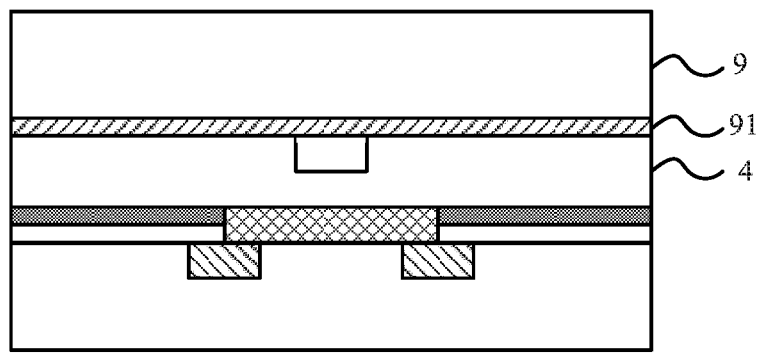
Figure 19:
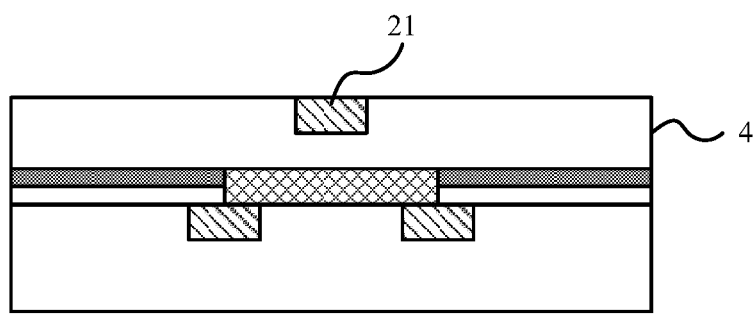

As shown in FIG. 5, in an embodiment of the present disclosure, the step of forming the second insulating layer 4 comprises sub-steps of:

S208, forming a third polydimethylsilane layer, as the second insulating layer 4, on the first insulating layer 3, as shown in FIG. 16;

S209, etching the second insulating layer 4 to form a second groove 41 corresponding to a pattern of the gate 21, as shown in FIG. 17;

S210, coating octadecyltrichlorosilane 91 on a glass substrate 9;

S211, contacting a surface of the glass substrate 9 coated with the octadecyltrichlorosilane 91 with a surface of the second insulating layer 4 formed with the second groove 41, as shown in FIG. 18;

S212, removing the glass substrate 9, and coating hydrophilic solution containing conductive material on the second insulating layer 4 to form the gate 21 in the second groove 41, as shown in FIG. 19.

By contacting the glass substrate 9 coated with the octadecyltrichlorosilane 91 with the second insulating layer 4, a surface of the second insulating layer 4 is in contact with the octadecyltrichlorosilane 91, so that the surface of the second insulating layer 4 has a decreased surface tension (surface energy) due to the octadecyltrichlorosilane 91, but the inside of the second groove 41 is not in contact with the octadecyltrichlorosilane 91, and still remains a relatively high surface tension of the third polydimethylsilane layer itself.

While coating hydrophilic solution (e.g., ethanol) containing conductive material (e.g., metals of aluminum, copper, molybdenum, etc., or alloys) on the second insulating layer 4, the surface of the second insulating layer 4 does not absorb the hydrophilic solution, but the inside of the second groove 41 absorbs the hydrophilic solution, furthermore, after evaporation of the hydrophilic solution, the metals or alloys in the hydrophilic solution are retained in the second groove 41 to form the gate 21.

By forming the source, the drain, the active layer and the gate in a manner of the present embodiment, the source, the drain, the active layer and the gate will be combined more stably and tightly with the layers where they locate, which facilitates to achieve good electrical functions of the thin film transistor. By forming the gate 21 in a manner of the present embodiment, the gate 21 is formed in the second insulating layer 4, the structure of the thin film transistor is firm.

Figure 6:
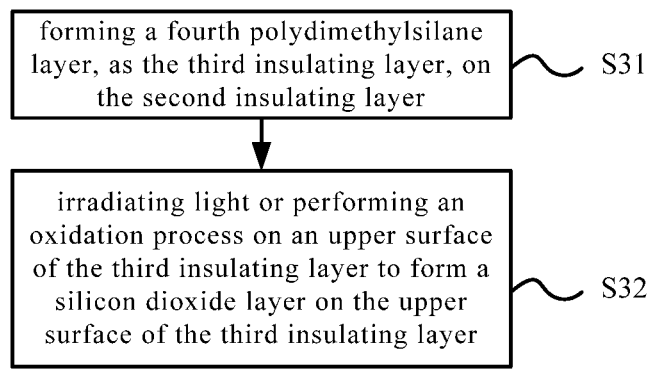
FIG. 6 shows a schematic flow chart of forming a third insulating layer in an embodiment of the present disclosure.
Figure 20:
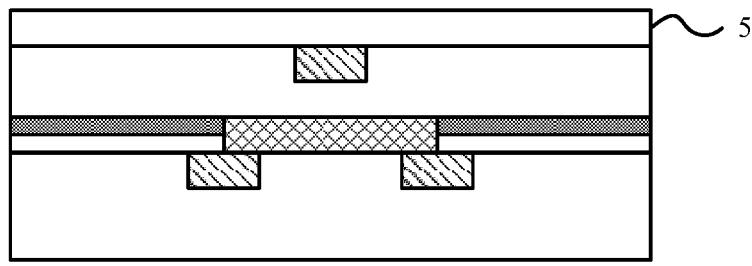
FIG. 20 and FIG. 21 show a specific schematic flow chart of forming the third insulating layer in an embodiment of the present disclosure.
Figure 21:
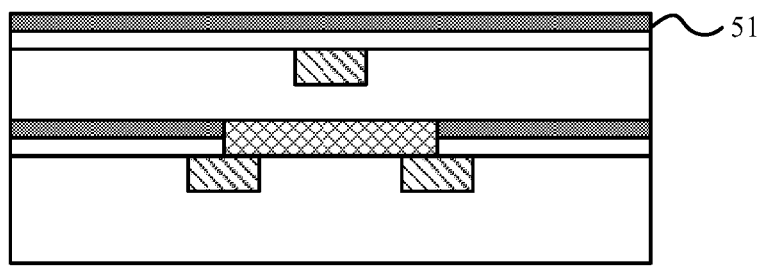

As shown in FIG. 6, in an embodiment of the present disclosure, the step (i.e., S3) of forming the third insulating layer 5 comprises sub-steps of:

S31, forming a fourth polydimethylsilane layer, as the third insulating layer 5, on the second insulating layer 4, as shown in FIG. 20;

S32, irradiating light or performing an oxidation process on an upper surface of the third insulating layer 5 so that a second silicon dioxide layer 51 is formed on the upper surface of the third insulating layer 5, as shown in FIG. 21.

Since the silicon dioxide is an inorganic material, by forming the second silicon dioxide layer 51 on the upper surface of the third insulating layer 5, the insulating layer of the thin film transistor has advantages of inorganic material. Moreover, the fourth polydimethylsilane layer comprises silicon element, a silicon dioxide layer may be directly formed on the surface of the fourth polydimethylsilane layer by irradiating light or performing an oxidation process thereon, the formed silicon dioxide layer and the fourth polydimethylsilane layer are as an integral, so that the structures of the layers are more compact.

In an embodiment of the present disclosure, the step (i.e., S5) of forming the fourth insulating layer 7 comprises sub-steps of:

forming the fourth insulating layer 7 on the pixel electrode 6 by at least one material of polydimethylsilane, polyimide, polymethyl methacrylate and polyvinyl pyrrolidone.

By above processes, the thin film transistor has a structure in which layers (the base 1 and the first insulating layer 3) of organic material, a layer (the first silicon dioxide layer 31) of inorganic material, layers (the second insulating layer 4 and the third insulating layer 5) of organic material, a layer (the second silicon dioxide layer 51) of inorganic material and a layer (the fourth insulating layer 7) of organic material are distributed alternatively, so that the thin film transistor simultaneously has advantages of comprising the organic material layers and advantages of comprising the inorganic material layers.

It should be noted that, the forming processes employed in the above procedures may include, for example, a film forming process such as depositing and sputtering, and a patterning process such as etching. The operation of irradiating light in the above procedures may be performed by irradiating using UV light, and the operation of the oxidation process in the above procedures may be performed by oxidizing using ozone.

The octadecyltrichlorosilane used in above processes may also be replaced by hexamethyldisiloxane.

The above processes of forming the base 1 and the insulating layers by the polydimethylsilane layer may further comprise curing the polydimethylsilane layer at a low temperature (e.g., curing for 4 hours at 60° C.). The above processes are illustrated exemplarily by taking forming a top gate thin film transistor as an example, but in fact, a bottom gate thin film transistor may also be formed by the above processes if required.

Figure 22:
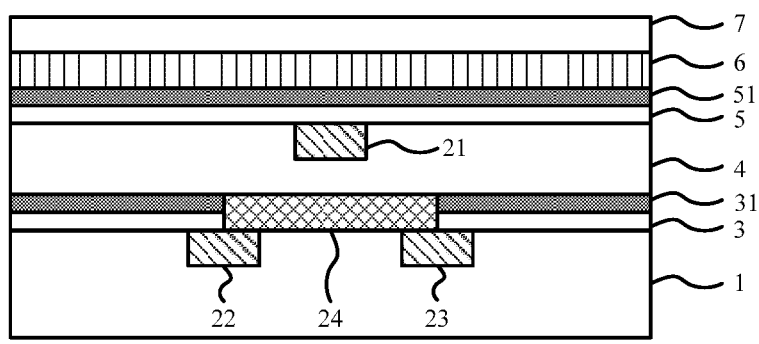
FIG. 22 shows a structural diagram of a display substrate in an embodiment of the present disclosure.

As shown in FIG. 22, in an embodiment of the present disclosure, there is also provided a display substrate manufactured by the above manufacturing method, the display substrate comprises:

a base 1;

a thin film transistor provided on the base 1, wherein, the thin film transistor comprises a gate 21, a source 22, a drain 23 and an active layer 24;

a first insulating layer 3 provided on the base 1, the active layer 24 is provided in the first insulating layer 3;

a second insulating layer 4 provided between the gate 21 and the active layer 24;

a third insulating layer 5 provided above the thin film transistor;

a pixel electrode 6 provided above the third insulating layer 5; and a fourth insulating layer 7 provided above the pixel electrode 6, wherein, a material of at least one of the base 1, the first insulating layer 3, the second insulating layer 4, the third insulating layer 5 and the fourth insulating layer 7 includes an organic material, and a material of at least one of the base 1, the first insulating layer 3, the second insulating layer 4, the third insulating layer 5 and the fourth insulating layer 7 includes an inorganic material.

In an embodiment of the present disclosure, a first groove 11 corresponding to patterns of the source 22 and the drain 23 is provided in a surface of the base 1 proximal to the first insulating layer 3, and the source 22 and the drain 23 are provided in the first groove 11.

In an embodiment of the present disclosure, a via hole 32 corresponding to a pattern of the active layer 24 is provided in the first insulating layer 3, and the active layer 24 is provided in the via hole 32, wherein, a material of the first insulating layer 3 includes polydimethylsilane, and a first silicon dioxide layer 31 is formed on an upper surface of the first insulating layer 3.

In an embodiment of the present disclosure, a second groove 41 corresponding to a pattern of the gate 21 is provided in a surface of the second insulating layer 4 proximal to the third insulating layer 5, and the gate 21 is provided in the second groove 41.

In an embodiment of the present disclosure, a material of the third insulating layer 5 includes polydimethylsilane, and a second silicon dioxide layer 51 is formed on an upper surface of the third insulating layer 5.

In an embodiment of the present disclosure, a material of the fourth insulating layer 7 includes at least one of polydimethylsilane, polyimide, polymethyl methacrylate and polyvinyl pyrrolidone.

In an embodiment of the present disclosure, there is also provided a display apparatus comprising the above display substrate.

It should be noted that, the display apparatus of the present embodiment may be any product or component with a display function, such as an electronic paper, a mobile phone, a tablet computer, a television, a display, a notebook computer, a digital photo frame, a navigator.

Technical solutions of the present disclosure have been described in detail with reference to the accompany drawings, in consideration of decrease of electrical properties of the thin film transistor due to forming the insulating layer of the thin film transistor only by organic material in the prior art and increase of complexity of the manufacturing process of the thin film transistor due to forming the insulating layer of the thin film transistor only by inorganic material, by forming a portion of the insulating layer and the base of the thin film transistor using organic material and forming the other portion of the insulating layer and the base of the thin film transistor using inorganic material, the thin film transistor will simultaneously have advantages of comprising the organic material layers and advantages of comprising the inorganic material layers, in an aspect, the manufacturing process is simplified, and in another aspect, electrical properties of the thin film transistor and the physical properties of the display substrate comprising the thin film transistor are improved.

It should be noted that, in the drawings, the sizes of the layers and regions may be enlarged for clearly showing. Moreover, it should be understood that, when an element or a layer is referred as being "on" another element or layer, it may be directly on another element or layer, or there may be one or more intermediate layers or elements therebetween. In addition, it should be understood that, when an element or a layer is referred as being "below" another element or layer, it may be directly below another element or layer, or there may be one or more intermediate layers or elements therebetween. Further, it should be understood that, when an element or a layer is referred as being "between" two elements or layers, it may be an unique element or layer between the two elements or layers, or there may be one or more other intermediate layers or elements between the two elements or layers. Similar reference sings indicate similar elements throughout the description.

In the present application, the terms of "first", "second", "third" and "fourth" are only used for illustrating, but cannot be understood to indicate or suggest relative importance. The terms of "multiple" refers to two or more than two, unless otherwise specified.

The above embodiments are merely preferred embodiments of the present disclosure, but the present disclosure is not limited thereto. Various modifications and improvements may be made by those skilled in the art, any of modifications, equivalent substitutions and improvements made within the spirit and essence of the present disclosure fall into the protection scope of the present disclosure.

The invention claimed is:

1. A manufacturing method of a display substrate, comprising steps of:
    forming a base;
    forming a thin film transistor on the base,
    wherein, the thin film transistor comprises a gate, a source, a drain and an active layer, a first insulating layer is formed on the base, and a second insulating layer is formed between the gate and the active layer, the active layer is formed in the first insulating layer;
    forming a third insulating layer above the thin film transistor;
    forming a pixel electrode above the third insulating layer;
    forming a fourth insulating layer above the pixel electrode,
    wherein a material of at least one of the first insulating layer, the second insulating layer, the third insulating layer and the fourth insulating layer includes an inorganic material, wherein the step of forming the base comprises:
    forming first bulges corresponding to patterns of the source and the drain respectively on a base substrate;
    forming a polydimethylsilane layer, which is hydroxyl-functionalized, on the base substrate, so that first grooves corresponding to patterns of the source and the drain are respectively formed at positions corresponding to the first bulges in a surface of the polydimethylsilane layer proximal to the base substrate;
    after forming the first grooves in the polydimethylsilane layer, stripping off the polydimethylsilane layer from the base substrate to form the base.

2. The manufacturing method of claim 1, wherein the step of forming the source and the drain comprises:
    coating octadecyltrichlorosilane on a glass substrate;
    contacting a surface of the glass substrate coated with the octadecyltrichlorosilane with a surface of the base formed with the first grooves;
    removing the glass substrate, and coating hydrophilic solution containing conductive material on the base, so that the source and the drain are formed in the first grooves, respectively.

3. The manufacturing method of claim 1, wherein the step of forming the fourth insulating layer comprises:
    forming the fourth insulating layer on the pixel electrode by at least one material of polydimethylsilane, polyimide, polymethyl methacrylate and polyvinyl pyrrolidone.

4. A manufacturing method of a display substrate, comprising steps of:
    forming a base;
    forming a thin film transistor on the base,
    wherein, the thin film transistor comprises a gate, a source, a drain and an active layer, a first insulating layer is formed on the base, and a second insulating layer is formed between the gate and the active layer, the active layer is formed in the first insulating layer;
    forming a third insulating layer above the thin film transistor;
    forming a pixel electrode above the third insulating layer;
    forming a fourth insulating layer above the pixel electrode,
    wherein the step of forming the thin film transistor comprises:
    forming a polydimethylsilane layer on the base to form the first insulating layer;
    irradiating light or performing an oxidation process on an upper surface of the first insulating layer so that a first silicon dioxide layer is formed on the upper surface of the first insulating layer;
    etching the first silicon dioxide layer and the first insulating layer to form a via hole corresponding to a pattern of the active layer;
    coating hydrophilic solution containing semi-conductive material on the first silicon dioxide layer to form the active layer in the via hole.

5. The manufacturing method of claim 4, wherein the step of forming the fourth insulating layer comprises:
    forming the fourth insulating layer on the pixel electrode by at least one material of polydimethylsilane, polyimide, polymethyl methacrylate and polyvinyl pyrrolidone.

6. A manufacturing method of a display substrate, comprising steps of:
    forming a base;
    forming a thin film transistor on the base,
    wherein, the thin film transistor comprises a gate, a source, a drain and an active layer, a first insulating layer is formed on the base, and a second insulating layer is formed between the gate and the active layer, the active layer is formed in the first insulating layer;

forming a third insulating layer above the thin film transistor;

forming a pixel electrode above the third insulating layer;

forming a fourth insulating layer above the pixel electrode, wherein a material of at least one of the base, the first insulating layer, the third insulating layer and the fourth insulating layer includes an inorganic material, wherein the step of forming the thin film transistor comprises:

forming a polydimethylsilane layer on the first insulating layer to form the second insulating layer;

etching the second insulating layer to form a second groove corresponding to a pattern of the gate;

coating octadecyltrichlorosilane on a glass substrate;

contacting a surface of the glass substrate coated with the octadecyltrichlorosilane with a surface of the second insulating layer formed with the second groove;

removing the glass substrate, and coating hydrophilic solution containing conductive material on the second insulating layer to form the gate in the second groove.

7. The manufacturing method of claim 6, wherein the step of forming the fourth insulating layer comprises:

forming the fourth insulating layer on the pixel electrode by at least one material of polydimethylsilane, polyimide, polymethyl methacrylate and polyvinyl pyrrolidone.

* * * * *